(12) United States Patent
Chen et al.

(10) Patent No.: US 7,212,699 B2
(45) Date of Patent: May 1, 2007

(54) FABRICATING A PHOTONIC DIE

(75) Inventors: Chien-Hua Chen, Corvallis, OR (US); Robert Newton Bicknell, Corvallis, OR (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

(21) Appl. No.: 11/092,489

(22) Filed: Mar. 25, 2005

(65) Prior Publication Data

US 2006/0215951 A1 Sep. 28, 2006

(51) Int. Cl.
*G02B 6/12* (2006.01)
*H01L 21/00* (2006.01)
(52) U.S. Cl. .......................... 385/14; 438/125
(58) Field of Classification Search ............. 385/14
See application file for complete search history.

(56) References Cited

U.S. PATENT DOCUMENTS

| 6,315,540 | B1* | 11/2001 | Tsuruta ....................... 425/123 |
|---|---|---|---|
| 6,588,949 | B1 | 7/2003 | Zhou |
| 6,674,159 | B1 | 1/2004 | Peterson et al. |
| 6,686,291 | B1* | 2/2004 | Hortaleza ................... 438/710 |
| 6,960,031 | B2* | 11/2005 | McFarland et al. ........... 385/89 |
| 2002/0197025 | A1 | 12/2002 | Vaganov et al. |
| 2003/0113074 | A1 | 6/2003 | Kohlstadt et al. |
| 2005/0233498 | A1* | 10/2005 | Kocian et al. .............. 438/116 |
| 2006/0030150 | A1* | 2/2006 | Jiang et al. ................. 438/673 |
| 2006/0035415 | A1* | 2/2006 | Wood et al. ................. 438/125 |
| 2006/0040421 | A1* | 2/2006 | Farnworth et al. .......... 438/106 |

* cited by examiner

*Primary Examiner*—Sung Pak
*Assistant Examiner*—Tina M Wong

(57) ABSTRACT

In one embodiment, a method includes forming an array of recesses in a substrate, depositing spacer material in the recesses, forming photonic elements on the spacer material, and separating the structure previously formed into individual dies that each include a photonic element, spacer material and substrate.

24 Claims, 5 Drawing Sheets

FABRICATING A PHOTONIC DIE

BACKGROUND

One method for fabricating light emitting photonic devices includes forming a photonic crystal structure on a sacrificial layer that extends over substantially all of the silicon substrate. A release etch removes the sacrificial layer so that the photonic crystal structure can be peeled off the substrate, cut into individual photonic elements and mounted onto a light fixture. This method requires handling the small individual photonic elements multiple times which can damage elements and reduce process yield.

DRAWINGS

DESCRIPTION

Embodiments of the present invention were developed in an effort to minimize the handling of individual photonic elements in the fabrication of light emitting photonic devices. Some embodiments of the invention, therefore, will be described with reference to light emitting photonic devices. Embodiments of the invention, however, are not limited to such devices. Rather, embodiments of the invention may be used in any application or environment which might benefit from the new processes and devices. The exemplary embodiments shown in the figures and described below illustrate but do not limit the invention. Other forms, details, and embodiments may be made and implemented. Hence, the following description should not be construed to limit the scope of the invention, which is defined in the claims that follow the description.

Figure 1:
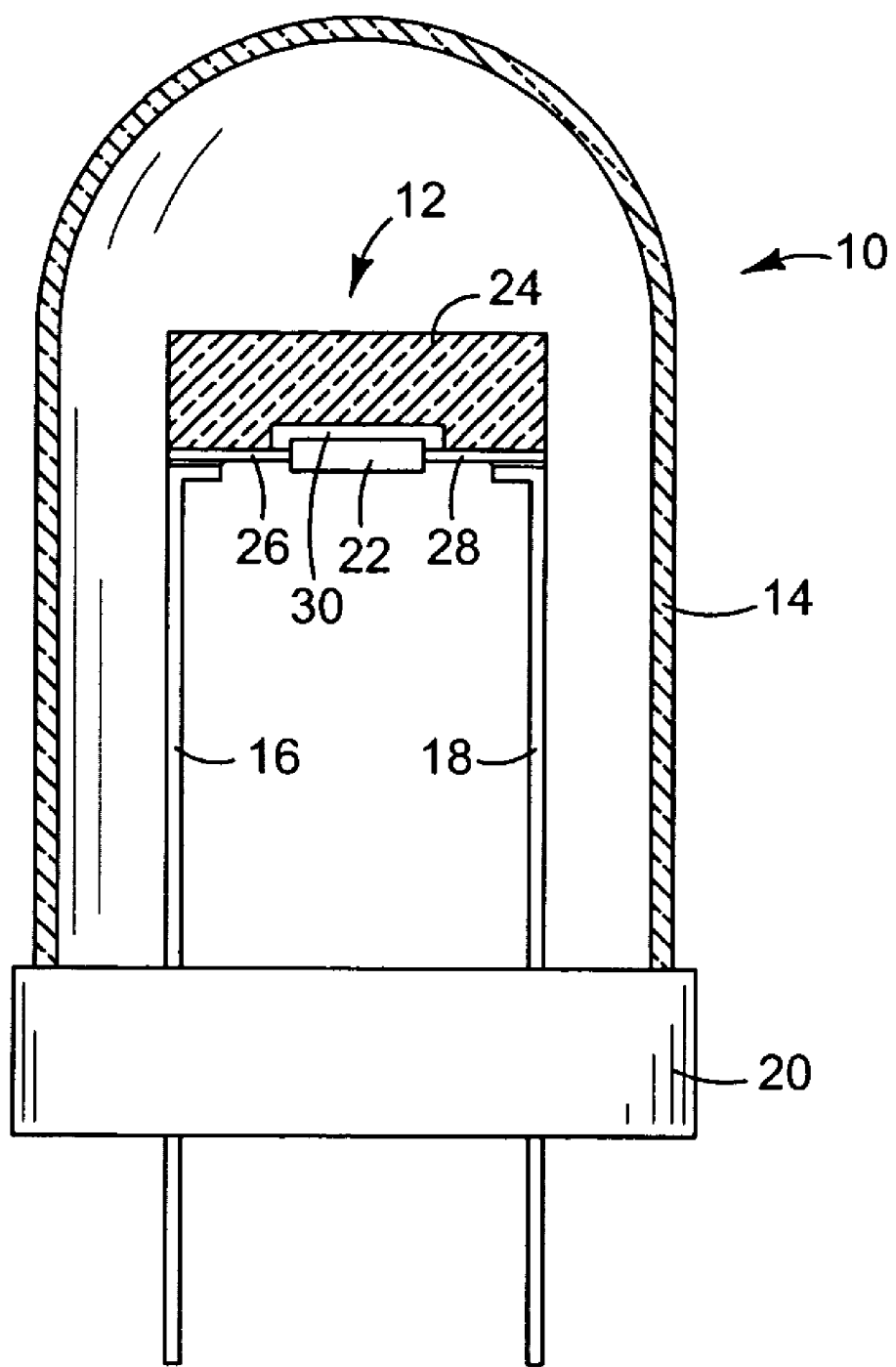
FIG. 1 illustrates a bulb type photonic device.

FIG. 1 illustrates a bulb type photonic device 10 that includes a die 12 suspended in a dome shaped housing 14. Die 12 is mounted on a pair of conductive posts 16 and 18 that extend through a base 20. Post 16 and 18 serve as the contact points for die 12 to external electrical signals. Die 12 includes a light emitting photonic element 22 affixed to a transparent substrate 24. A "photonic element" as used in this document means any material or structure that exhibits changes in the index of material on a length scale comparable to optical wavelengths, including but not limited to photonic crystals and other photonic bandgap materials. "Transparent" as used in this document means the property of transmitting one or more of infrared light, visible light or ultra-violet light. For example, in a photonic device 10 for use in a projector or display, substrate 24 will be transparent at least to visible light but need not be transparent to infrared and ultraviolet light. In another example, in a photonic device 10 for use in an infrared laser, substrate 24 will be transparent at least to infrared light but need not be transparent to visible and ultraviolet light. Photonic element 22 is suspended on conductive leads 26 and 28 across a recess 30 formed in substrate 24. Base 20 is made from glass or another suitable insulating material. Housing 14 is made from glass or another suitable transparent material and sealed against base 20 using, for example, glass frit. The interior of housing 14 may be filled with an inert or halogen gas to help protect the interior components from environmental degradation and to help achieve the desired performance characteristics for device 10.

Figure 2:
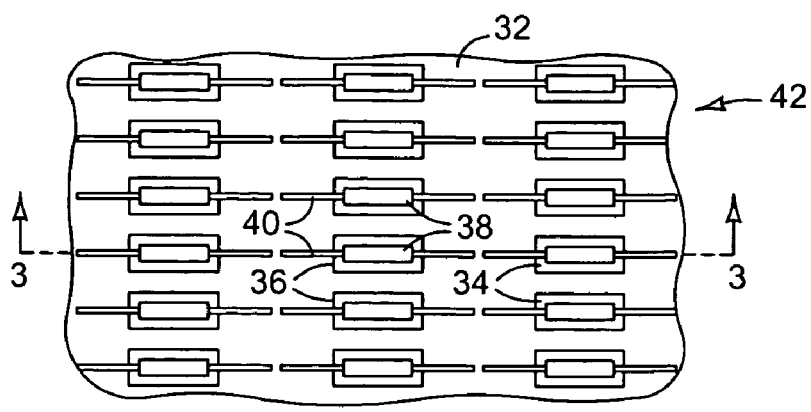
FIGS. 2–7 illustrate steps in the process of fabricating photonic devices such as the one shown in FIG. 1.
Figure 3:
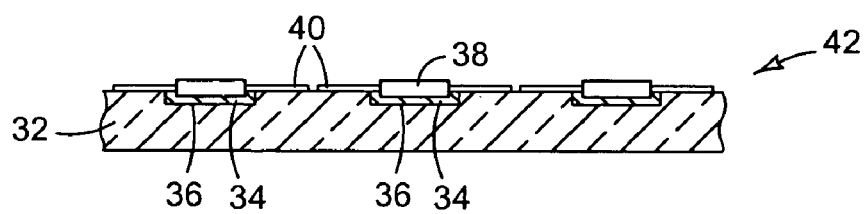

A process for fabricating photonic devices such as photonic device 10 in FIG. 1 will now be described with reference to FIGS. 2–7. FIGS. 2 and 3 illustrate a transparent wafer 32 that has been partially processed using conventional wafer processing techniques. FIG. 2 is a top down plan view of a portion of wafer 32. FIG. 3 is a partial section view taken along the line 3—3 in FIG. 2. In the embodiment shown, wafer 32 forms the substrate for the finished dies and, therefore, wafer 32 is also sometimes referred to as substrate 32. Substrate 32, for example, may be made of glass, sapphire or silicon. In other embodiments, the substrate on which the other features are formed could itself be formed on an underlying wafer or other structural feature. Where, as here, a light emitting device is being fabricated, a transparent wafer is the desired starting material Referring to FIGS. 2 and 3, a sacrificial layer of spacer material 34 is deposited in recesses 36 formed along the surface of substrate 32. Recesses 36 are etched into or otherwise formed in substrate 32 in the desired layout for photonic elements 38 and conductive leads 40. Spacers 34 provide a temporary base on which photonic elements 38 are formed. Spacers 34 are removed later in the process to expose cavities around one side of photonic elements 38. It is desirable, therefore, to form spacers 34 from a material that is selectively etch able with respect to substrate 32, photonic elements 38, and leads 40. In the layout shown in FIG. 2, each recess 36 is generally rectangular so that the photonic element 38 will be completely surrounded by the transparent substrate 32 (in a plane along the surface of the substrate). In devices in which it is not necessary or desirable that substrate 32 surround photonic element 38, then some processing efficiency may be realized by laying out recesses 36 as a series of trenches etched into the surface of substrate 32. For such trench recesses, each photonic element 38 is bordered by transparent substrate 32 on only two sides, rather than on all four sides as in the layout shown in FIG. 2.

Once spacers 34 have been formed, photonic elements 38 are formed over substrate 32 at the spacer locations. A layer of metal or other conductive material is then applied over substrate 32 and elements 38, and patterned to achieve the in-process wafer structure 42 shown in FIGS. 2 and 3. Alternatively, the conductive layer may be formed first on substrate 32, patterned to form leads 40, and then the photonic elements 38 formed over substrate 32. In the embodiment shown, each spacer 34 is itself recessed so that each photonic element 38 sits down into spacer 34, partially surrounded by substrate 32. The recess may be formed in spacer 34 by etching away spacer material or by applying a conforming layer of spacer material that does not completely fill a recess 36 in substrate 32. The extent to which the photonic elements 38 are recessed into substrate 32, if at all, will depend on the desired performance characteristics of the device. If spacers 34 are not recessed, then photonic elements 38 may be formed layer by layer over substrate 32 and a conductive layer applied to communicate with photonic elements 38. As noted above, each photonic element 38 represents generally any material or structure that exhibits changes in the index of material on a length scale comparable to optical wavelengths, including but not limited to one dimensional, two dimensional and three dimensional photonic crystals and other photonic bandgap materials. Photonic elements 38 may be formed on substrate 32 using any suitable technique.

Figure 4:
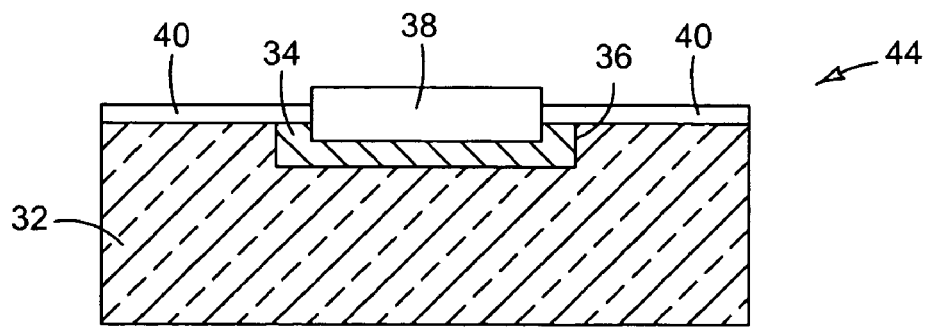
Figure 5:
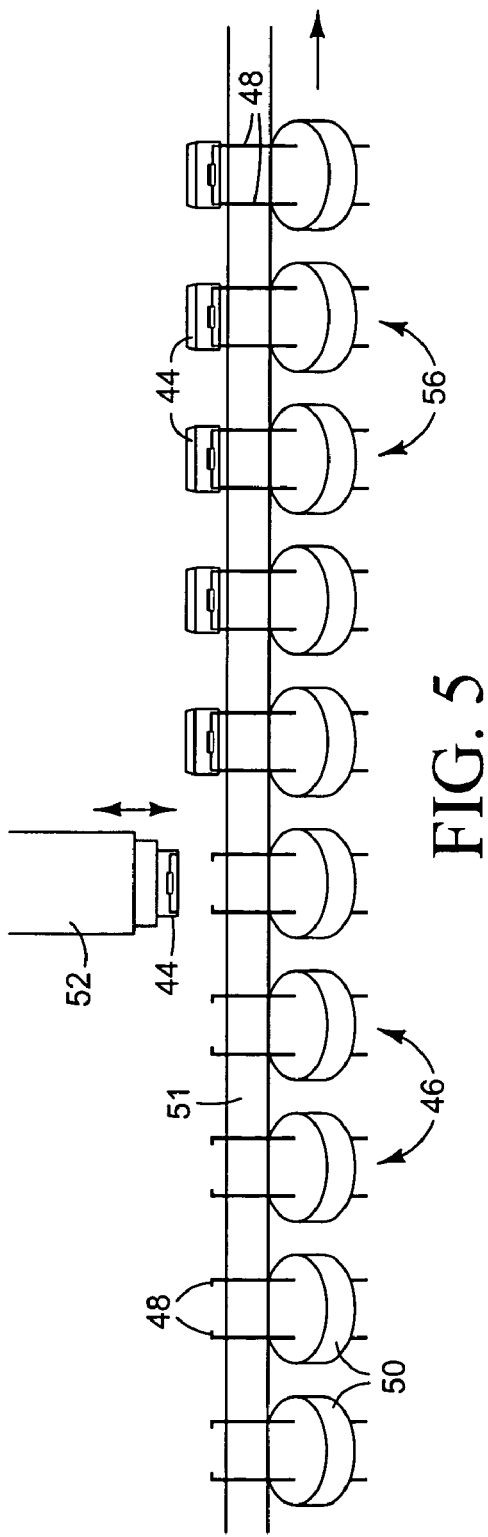
Figure 7:
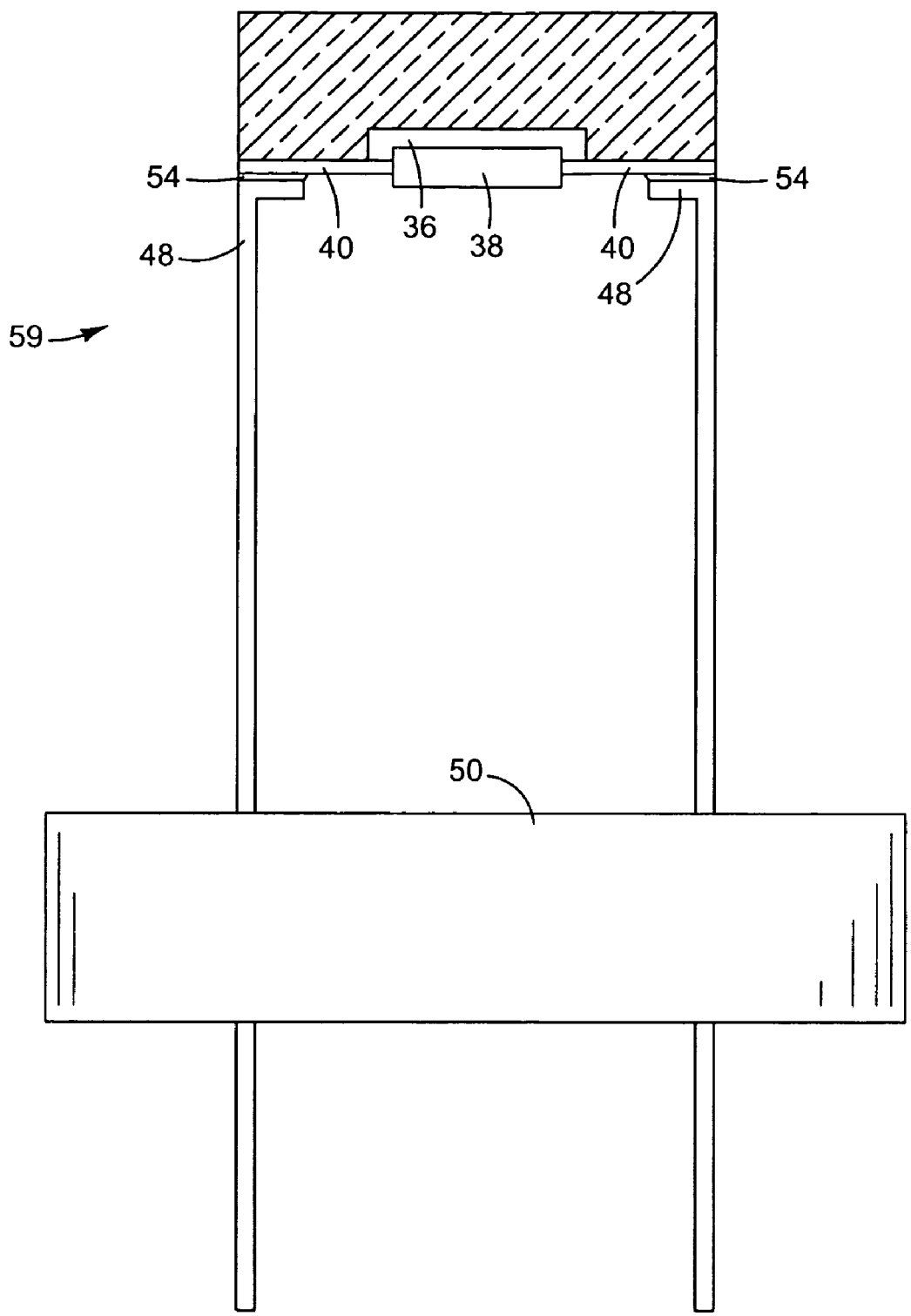

The in-process wafer structure 42 shown in FIGS. 2 and 3 is then cut or otherwise separated into individual dies. One such die, designated by part number 44, is shown in FIG. 4. Die 44 is referred to as an in-process die 44 because sacrificial spacer 34 has not yet been removed to form the final die structure. Spacer 34 supports the small, fragile photonic elements 38 and leads 40 during the die cut and mounting operations. Referring now to FIG. 5, each in-process die 44 is mounted to a pre-fabricated base assembly 46. Base assembly 46 includes conductive posts 48 protruding from base 50. While any suitable process may be used to mount the dies 44, an automated "pick and place" process in which the base assemblies 46 are fed to the work station on a tape 51 is illustrated. A robotic vacuum tool 52 may be used to "pick" each die 44 from a supply of dies and "place" the die 44 on posts 48. Solder printed onto the tip of each post 48 is then flowed to mechanically secure and electrically connect die 44 to posts 48. Glass frit (not shown) may also be applied to the connection for added mechanical strength. A solder connection 54 between die 44 and posts 48 is shown in FIG. 7.

Figure 6:
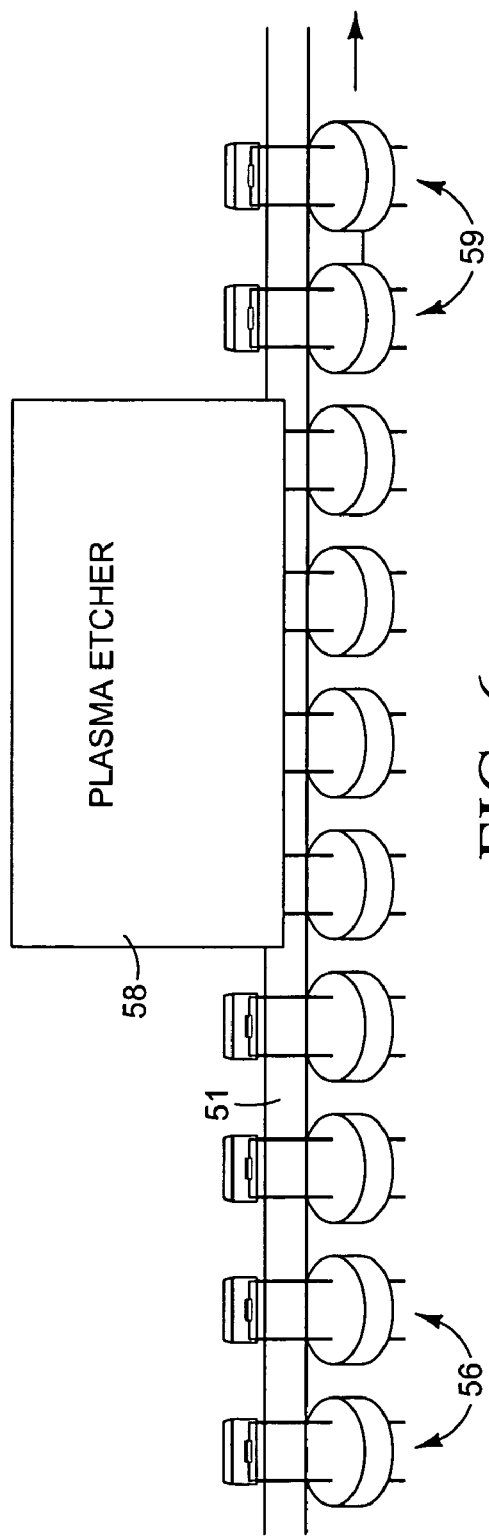

Referring to FIG. 6, once dies 44 have been mounted on posts 48 to form in-process assemblies 56, spacers 34 may be removed in a processing step that is sometimes referred to as a "filament release." Spacers are removed by, for example, exposing dies 44 to the atmosphere in a plasma etcher 58. Although other removal techniques may be used, plasma etching is desirable because it allows a continuation of the "assembly line" fabrication process utilized to mount dies 44 and the plasma etching equipment widely used in semiconductor wafer processing is easily adapted to the removal of spacers 34. The resulting structure 59 is shown in FIG. 7. A dome shaped housing is then mounted and sealed to the base to complete the photonic device 10, as depicted in FIG. 1.

Figure 8:
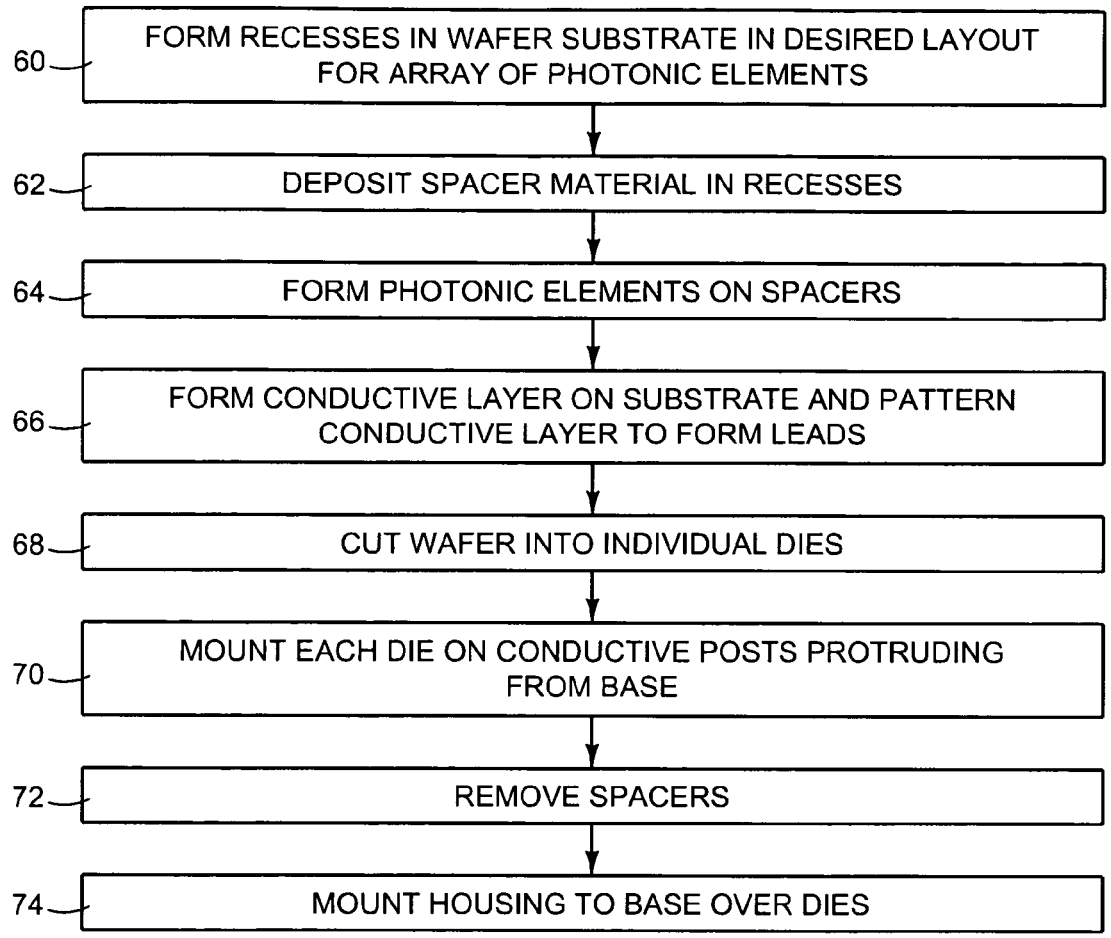
FIG. 8 is a flow chart illustrating a process for fabricating photonic devices such as the one shown in FIG. 1.

The process flow described above for forming a photonic device is illustrated in the flow diagram of FIG. 8. Referring to FIG. 8, recesses are formed in the surface of a transparent wafer substrate in a desired layout for an array of photonic elements (step 60). A sacrificial layer of spacer material is deposited in the recesses (step 62). An array of photonic elements is then formed on the spacers (step 64). A layer of metal or other conductive material is formed on the substrate and then patterned to form conductive leads (step 66). The wafer is cut into individual dies (step 68) and each die is mounted on a pair of conductive posts protruding from a base (step 70). The spacers are then removed (step 72) and a transparent housing in mounted to the base over the dies (step 74).

The photonic device 10 shown in FIG. 1, in which a light emitting photonic element 22 is used to generate light, is just one example of a device that may be fabricated using the new processing techniques. Other configurations are possible. Photonic waveguides, for example, may be fabricated using processing techniques according to various embodiments of the invention. Embodiments of the invention also are not limited to fabricating bulb type photonic devices, but may be used to fabricate photonic devices in, for example, flat window packages and molded plastic packages. The fabrication process illustrated in FIGS. 2–8 minimizes the handling of individual photonic elements, and the spacer supporting the photonic element is not removed until after the die has been securely mounted in its final position. In addition, conventional semiconductor wafer processing and mounting techniques and equipment may be readily adapted for use in the process.

As noted at the beginning of this Description, the exemplary embodiments shown in the figures and described above illustrate but do not limit the invention. Other forms, details, and embodiments may be made and implemented. Therefore, the foregoing description should not be construed to limit the scope of the invention, which is defined in the following claims.

What is claimed is:

1. A method, comprising:
   forming an array of recesses in a substrate;
   suspending a photonic element on conductive leads across each recess; and
   separating a structure previously formed into individual dies that each include a photonic element, conductive leads and a portion of the substrate.

2. The method of claim 1, wherein suspending a photonic element on conductive leads across each recess comprises:
   depositing spacer material in the recesses;
   forming the photonic elements on the spacer material;
   forming conductive leads on the substrate in electrical contact with the photonic elements; and
   removing spacer material from each die.

3. The method of claim 2, wherein the spacer material is selectively etch able with respect to the substrate and the photonic elements and removing spacer material from each die comprises plasma etching the spacer material from each die.

4. The method of claim 2, wherein forming photonic elements on the spacer material comprises forming a single photonic element on the spacer material in each recess.

5. The method of claim 4, further comprising surrounding each photonic element with substrate in a plane along a surface of the substrate.

6. The method of claim 2, wherein forming photonic elements on the spacer material comprises forming photonic crystals on the spacer material.

7. The method of claim 1, wherein the substrate is transparent to light emitted by the photonic elements.

8. The method of claim 7, wherein the substrate comprises glass, sapphire or silicon.

9. A method, comprising:
   forming light emitting photonic elements on a substrate transparent to light emitted by the photonic elements;
   forming conductive leads on the substrate in electrical contact with the photonic elements;
   separating a structure previously formed into individual dies that each include a photonic element, a portion of the substrate and conductive leads;
   suspending each die in a transparent housing; and
   connecting the leads on each die to conductors that protrude from the housing.

10. The method of claim 9, wherein the housing comprises an opaque base and a transparent cover.

11. The method of claim 9, wherein forming light emitting photonic elements on a substrate transparent to light emitted by the photonic elements comprises forming light emitting photonic crystals on a substrate transparent to light emitted by the photonic crystals.

12. The method of claim 9, wherein the substrate comprises glass, sapphire or silicon.

13. A method, comprising:
   forming an array of recesses in a transparent substrate;
   depositing spacer material in each recess;
   forming a light emitting photonic element on the spacer material in each recess;
   forming conductive leads on the substrate in electrical contact with the photonic elements;

separating a structure previously formed into individual dies that each include a photonic element, spacer material, a portion of the substrate and conductive leads extending from the photonic element to the substrate;

connecting the leads on each die to conductors;

suspending each die on the conductors; and Then removing spacer material from the recesses.

14. The method of claim 13, wherein removing spacer material from the recesses comprises removing substantially all of the spacer material from the recesses.

15. The method of claim 13, further comprising enclosing all of each die and only a portion of the conductors connected to leads on the die in a transparent housing.

16. The method of claim 15, wherein the housing comprises an opaque base and a transparent cover.

17. The method of claim 16, further comprising supporting each photonic element on the conductive leads across a recess in the substrate.

18. A photonic die assembly, comprising:
a photonic die comprising
  a substrate having a recess therein,
  spacer material in the recess,
  a light emitting phatonic element supported on the spacer material, the recess surrounding the photonic element in a plane along a surface of the substrate, the substrate transparent to light emitted by the photonic element, and
  conductive leads along the surface of the substrate, the leads in electrical contact with the photonic element; and
conductive posts mounting the photonic die, each past contacting a different lead and the photonic element suspended between the posts.

19. The die assembly of claim 18, wherein the photonic element comprises a photonic crystal.

20. The die assembly of claim 18, wherein the substrate comprises glass, sapphire or silicon.

21. The die assembly of claim 18, wherein the spacer material is selectively etch able with respect to the substrate and the photonic element.

22. A photonic light bulb, comprising:
a die comprising a transparent substrate, conductive leads along a surface of the substrate, and a light emitting photonic element supported on the conductive leads across a recess in the substrate;
conductive posts mounting the die, each post contacting a different lead and the photonic element suspended between the posts; and
a transparent housing enclosing the die and only part of the posts such that the posts protrude from the housing, the die suspended within the housing on the posts.

23. The photonic light bulb of claim 22, wherein the die is surrounded by an inert gas or halogen gas within the enclosure.

24. The photonic light bulb of claim 22, wherein the housing comprises an opaque base and a transparent cover, the posts supported in and extending through the base.

* * * * *